(12) United States Patent
Anholt et al.

(10) Patent No.: US 8,327,242 B1
(45) Date of Patent: Dec. 4, 2012

(54) HIGH-PERFORMANCE ECC DECODER

(75) Inventors: Micha Anholt, Tel Aviv (IL); Naftali Sommer, Rishon Le-Zion (IL); Gil Semo, Tel Aviv (IL); Tal Inbar, Hod-Hasharon (IL)

(73) Assignee: Apple Inc., Cupertino, CA (US)

( * ) Notice: Subject to any disclaimer, the term of this patent is extended or adjusted under 35 U.S.C. 154(b) by 911 days.

(21) Appl. No.: 12/419,304

(22) Filed: Apr. 7, 2009

Related U.S. Application Data

(60) Provisional application No. 61/043,734, filed on Apr. 10, 2008, provisional application No. 61/043,736, filed on Apr. 10, 2008, provisional application No. 61/061,685, filed on Jun. 16, 2008, provisional application No. 61/105,454, filed on Oct. 15, 2008.

(51) Int. Cl.
*H03M 13/00* (2006.01)
(52) U.S. Cl. .................................... 714/785
(58) Field of Classification Search ............ 714/752, 714/753, 774, 781–786, 793, 794, 799
See application file for complete search history.

(56) References Cited

U.S. PATENT DOCUMENTS

| | | | |
|---|---|---|---|
| 4,845,713 A | 7/1989 | Zook | |
| 5,267,242 A | 11/1993 | Lavallee et al. | |
| 5,887,005 A * | 3/1999 | Sharma | 714/784 |
| 5,887,006 A * | 3/1999 | Sharma | 714/784 |
| 6,047,395 A | 4/2000 | Zook | |
| 6,279,137 B1 * | 8/2001 | Poeppelman et al. | 714/781 |
| 6,353,909 B1 | 3/2002 | Amrany et al. | |
| 6,385,751 B1 | 5/2002 | Wolf | |
| 6,631,488 B1 | 10/2003 | Stambaugh et al. | |
| 6,637,002 B1 * | 10/2003 | Weng et al. | 714/781 |
| 6,671,850 B1 * | 12/2003 | Cox et al. | 714/781 |
| 6,938,196 B2 | 8/2005 | Richardson et al. | |
| 6,982,659 B2 | 1/2006 | Shen et al. | |
| 7,206,992 B2 * | 4/2007 | Xin | 714/782 |
| 7,475,103 B2 | 1/2009 | Novichkov et al. | |

(Continued)

FOREIGN PATENT DOCUMENTS

WO 2007052991 A1 5/2007
(Continued)

OTHER PUBLICATIONS

Darabiha et al., "Power Reduction Techniques for LDPC Decoders", IEEE Journal of Solid-State Circuits, vol. 43, No. 8, pp. 1835-1845, Aug. 2008.

(Continued)

*Primary Examiner* — Nadeem Iqbal
(74) *Attorney, Agent, or Firm* — Meyertons, Hood, Kivlin, Kowert & Goetzel, P.C.

(57) ABSTRACT

Methods for Error Correction Code (ECC) decoding include producing syndromes from a set of bits, which represent data that has been encoded with the ECC. An Error Locator Polynomial (ELP) is generated based on the syndromes. At least some of the ELP roots are identified, and the errors indicated by these roots are corrected. Each syndrome may be produced by applying to the bits vector operations in a vector space. Each syndrome is produced by applying vector operations using a different basis of the vector space. The ELP may be evaluated on a given field element by operating on ELP coefficients using serial multipliers, wherein each serial multiplier performs a sequence of multiplication cycles and produces an interim result in each cycle. Responsively to detecting at least one interim result indicating that the given element is not an ELP root, the multiplication cycles are terminated before completion of the sequence.

24 Claims, 6 Drawing Sheets

U.S. PATENT DOCUMENTS

| | | | |
|---|---|---|---|
| 7,478,310 | B2 | 1/2009 | Jung et al. |
| 7,590,923 | B1* | 9/2009 | Kikuchi et al. ............... 714/780 |
| 2004/0181735 | A1* | 9/2004 | Xin ................................ 714/758 |
| 2007/0198895 | A1 | 8/2007 | Paumier et al. |
| 2008/0172592 | A1 | 7/2008 | Wehn et al. |
| 2008/0198650 | A1 | 8/2008 | Shalvi et al. |
| 2009/0024905 | A1 | 1/2009 | Shalvi et al. |
| 2009/0070659 | A1 | 3/2009 | Zhong et al. |
| 2009/0077449 | A1 | 3/2009 | Lee |
| 2009/0094470 | A1 | 4/2009 | Gao et al. |
| 2009/0106485 | A1 | 4/2009 | Anholt |
| 2009/0187803 | A1 | 7/2009 | Anholt et al. |
| 2009/0199074 | A1 | 8/2009 | Sommer |
| 2009/0249159 | A1 | 10/2009 | Lee et al. |
| 2009/0282320 | A1 | 11/2009 | Liao et al. |
| 2010/0306626 | A1 | 12/2010 | Keays et al. |

FOREIGN PATENT DOCUMENTS

| | | | |
|---|---|---|---|
| WO | 2007132453 | A2 | 11/2007 |
| WO | 2007132457 | A2 | 11/2007 |
| WO | 2008026203 | A2 | 3/2008 |
| WO | 2008053472 | A2 | 5/2008 |
| WO | 2008139441 | A2 | 11/2008 |
| WO | 2009072103 | A2 | 6/2009 |
| WO | 2009072105 | A2 | 6/2009 |
| WO | 2009074979 | A2 | 6/2009 |

OTHER PUBLICATIONS

Blahut, R., "Algebraic Codes for Data Transmission", Chapter 3.6, pp. 62-63, Cambridge University Press 2003.

Chen et al., "Small Area Parallel Chien Search Architectures for Long BCH Codes", IEEE Transactions on Very Large Scale Integration (VLSI) Systems, vol. 12, No. 5, pp. 656-549, May 2004.

Ha et al., "Rate-Compatible Punctured Low Density Parity Check Codes with Short Block Lengths", IEEE Transactions on Information Theory, vol. 52, No. 2, pp. 728-738, Feb. 2006.

Han et al., "An Efficient Dynamic Schedule for Layered Belief-Propagation Decoding of LDPC Codes", IEEE Communication Letters, vol. 13, No. 12, pp. 950-952, Dec. 2009.

IEEE Standard 802.11n-2009 "IEEE Standard for Information Technology—Telecommunications and Information Exchange Between Systems—Local and Metropolitan Area Networks—Specific Requirements Part 11: Wireless LAN Medium Access Control (MAAC) and Physical Layer (PHY) Specifications", Oct. 29, 2009.

Kim et al., "Design of Rate-Compatible Irregular LDPC Codes for Incremental Redundancy Hybrid ARQ Schemes", IEEE International Symposium on Information Theory (ISIT), pp. 1139-1143, Seattle, USA, Jul. 2006.

Kou et al., "Low Density Parity Check Codes Based on Finite Geometries: A Rediscovery and New Results", IEEE Transactions on Information Theory, vol. 47, No. 7, pp. 2711-2736, Nov. 2001.

Li et al., "Rate-Compatible Low Density Parity Check Codes for Capacity-Approaching ARQ Schemes in Packet Data Communications", Proceedings of the International Conference on Communications, Internet and Information Technology (CIIT), U.S. Virgin Islands, Nov. 2002.

Yazdani et al., "On Construction of Rate-Compatible Low-Density Parity-Check Codes", IEEE Communication Letters, vol. 8, No. 3, pp. 159-161, Mar. 2004.

U.S. Appl. No. 12/843,029 "Efficient LDPC codes", filed on Jul. 25, 2010.

U.S. Appl. No. 12/797,615 "Chien search using multiple basis representation", filed on Jun. 10, 2010.

Anholt et al., U.S. Appl. No. 12/728,289 "Dual ECC Decoder" filed on Mar. 22, 2010.

Forney, D. G., "Generalized Minimum Distance Decoding", IEEE Transactions on Information Theory, vol. IT-12, No. 2, pp. 125-131, Apr. 1966.

Sharon et al., "Efficient Serial Message-Passing Schedules for LDPC Decoding", IEEE Transactions on Information Theory, vol. 53, No. 11, pp. 4076-4091, Nov. 2007.

Wu et al., "Parallel Weighted Bit-Flipping Decoding", IEEE Communication Letters, vol. 11, No. 8, pp. 671-673, Aug. 207.

Lin et al., "Error control coding: fundamentals and applications", chapter 17.6, pp. 871-880, 2nd edition, Pearson Education, Inc., USA, 2004.

Gallager, R.G., "Low-Density Parity-Check Codes", IRE Transactions on Information Theory, pp. 21-28, Jan. 1962.

Gallager, R.G., "Low-Density Parity-Check Codes", Cambridge, USA, Jul. 1963.

Bez et al., "Introduction to Flash memory", Proceedings of the IEEE, vol. 91, No. 4, pp. 489-502, Apr. 2003.

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Chase, D., "A Class of Algorithms for Decoding Block Codes with Channel Measurement Information", IEEE Transactions on Information Theory, vol. IT-18, No. 1, pp. 170-182, Jan. 1972.

Blahut, R.E., "Theory and Practice of Error Control Codes", chapter 6, sections 6.1-6.3, pp. 130-140, Addison-Wesley Publishing Company, Inc., USA, 1983.

Blahut, R.E., "Algebraic Codes for Data Transmission", chapter 6, pp. 131-166, and chapter 7, pp. 179-190, 217-233, Cambridge University Press, UK, 2004.

Chien, R.T., "Cyclic Decoding Procedures for Bose-Chaudhuri-Hocquenghem Codes", IEEE Transactions on Information Theory, vol. IT-10, pp. 357-363, Oct. 1964.

Lin et al., "Error control coding: fundamentals and applications", chapter 6, pp. 209-215, and chapter 7, pp. 241-255, 2nd edition, Pearson Education, Inc., USA, 2004.

Anholt et al., U.S. Appl. No. 12/355,817 "Decoding of Error Correction Code Using Partial Bit Inversion" filed on Jan. 19, 2009.

Whiting, D.L., "Bit-Serial Reed-Solomon Decoders in VLSI", Doctor Thesis, California Institute of Technology, Aug. 22, 1984.

U.S. Appl. No. 12/355,817 Official Action dated Dec. 22, 2011.

* cited by examiner

HIGH-PERFORMANCE ECC DECODER

CROSS-REFERENCE TO RELATED APPLICATIONS

This application claims the benefit of U.S. Provisional Patent Application 61/043,734, filed Apr. 10, 2008, U.S. Provisional Patent Application 61/043,736, filed Apr. 10, 2008, U.S. Provisional Patent Application 61/061,685, filed Jun. 16, 2008, and U.S. Provisional Patent Application 61/105,454, filed Oct. 15, 2008, whose disclosures are incorporated herein by reference.

FIELD OF THE INVENTION

The present invention relates generally to Error Correction Coding (ECC), and particularly to methods and systems for high-performance ECC decoding.

BACKGROUND OF THE INVENTION

Error Correction Codes (ECC) are used in a variety of applications, such as in various digital communication and data storage applications. Some ECC decoders apply a multistage process, which decodes ECC code words by calculating syndromes of the code words, and using the syndromes to generate Error Locator Polynomials (ELPs) whose roots indicate the error locations in the code words, finding the ELP roots and correcting the errors. Some ECC types that are commonly decoded using such a process comprise, for example, Bose-Chaudhuri-Hocquenghem (BCH) codes and Reed-Solomon (RS) codes.

Various schemes for generating ELPs from syndromes are known in the art. Some well-known schemes comprise, for example, the Berlekamp-Massey algorithm, the Euclidean algorithm and the Peterson Gorenstein Zierler algorithm. Examples of methods for determining ELPs are described, for example, by Lin and Costello in "Error Control Coding Fundamentals," Prentice Hall, second edition, 2004, chapter 6, pages 209-215 and chapter 7, pages 241-255, and by Blahut in "Algebraic Codes for Data Transmission," Cambridge University Press, 2004, chapter 6, pages 131-166 and chapter 7, pages 179-190 and 217-223, which are incorporated herein by reference.

A method for finding ELP roots is described by Chien in "Cyclic Decoding Procedure for the Bose-Chaudhuri-Hocquenghem Codes," IEEE Transactions on Information Theory, vol. IT-10, October, 1964, pages 357-363, which is incorporated herein by reference. This method is commonly known as the "Chien search."

SUMMARY OF THE INVENTION

An embodiment of the present invention provides a method for decoding an Error Correction Code (ECC), including:

using hardware-implemented logic, producing from a set of bits, which represent data that has been encoded with the ECC, multiple syndromes by applying to the bits vector operations in a vector space, wherein each syndrome is produced by applying the vector operations to the set of bits using a respective, different basis of the vector space;

generating, based on the multiple syndromes, an Error Locator Polynomial (ELP) whose roots are indicative of locations of respective errors in the set of bits; and identifying at least some of the roots of the ELP and correcting the errors indicated by the identified roots.

In some embodiments, producing the syndromes includes selecting each basis such that the vector operations used for producing the respective syndrome comprise a multiplication of a sparse matrix. In an embodiment, the syndromes are defined over a field having a primitive element, and selecting each basis includes defining a set of basis elements as respective multiples of a given vector by different powers of the primitive element of the field. In a disclosed embodiment, the field includes a Galois field. In an embodiment, after producing the syndromes, the syndromes are transferred to a common basis of the vector space.

There is additionally provided, in accordance with an embodiment of the present invention, a method for decoding an Error Correction Code (ECC), including:

accepting coefficients of an Error Locator Polynomial (ELP), which is defined over a field and whose roots are indicative of locations of respective errors in a set of bits, which represent data that has been encoded with the ECC;

evaluating the ELP on a given element of the field by operating on the coefficients using respective hardware-implemented serial multipliers, such that each serial multiplier performs a sequence of multiplication cycles and produces an interim result in each cycle;

responsively to detecting, during the sequence of the multiplication cycles, at least one interim result indicating that the given element is not one of the roots of the ELP, terminating the multiplication cycles before completion of the sequence; and when the interim results indicate that the given element is a root of the ELP, correcting at least one error indicated by the given element.

In some embodiment, evaluating the ELP includes applying the ELP concurrently to multiple elements of the field using respective multiple sets of the serial multipliers. In a disclosed embodiment, terminating the multiplication cycles includes terminating the multiplication cycles applied to the multiple elements responsively to determining, based on the interim results, that none of the multiple elements comprises an ELP root. In another embodiment, terminating the multiplication cycles includes terminating the multiplication cycles applied to one of the multiple elements irrespective of termination of the multiplication cycles applied to the other elements.

In yet another embodiment, when a rank of the ELP does not exceed half of a number of the serial multipliers in each of the sets of the serial multipliers, applying the ELP includes dividing each of the sets of the serial multipliers into first and second subsets, and applying the ELP concurrently to respective first and second elements of the field using the first and second subsets of the serial multipliers.

There is also provided, in accordance with an embodiment of the present invention, a method for decoding an Error Correction Code (ECC), including:

in an ECC decoder that includes multiple logic components that are clocked by a clock signal, accepting an Error Locator Polynomial (ELP), which has a given rank and is defined over a field, and whose roots are indicative of locations of respective errors in a set of bits, which represent data that has been encoded with the ECC;

based on the rank of the ELP, selectively disabling the clock signal to some of the logic components that are used for computing the roots of the ELP;

identifying the roots of the ELP using the logic components for which the clock signal has not been disabled; and correcting the errors indicated by the identified roots.

In some embodiments, the logic components are arranged in a first number of subsets, each of which is assigned to process a respective ELP coefficient, the ELP includes a second number of ELP coefficients, smaller than the first number, and selectively disabling the clock signal includes providing the clock signal only to the subsets that are assigned to process the second number of the coefficients. In a disclosed embodiment, a rate of the clock signal is modified responsively to the rank of the ELP. In another embodiment, the method includes, upon identifying a root of the ELP, dividing the ELP by a factor that depends on the identified root to produce a lower-rank ELP, and continuing to identify the roots of the lower-rank ELP. In yet another embodiment, the logic components include at least one component type selected from a group of types consisting of multipliers and registers.

There is further provided, in accordance with an embodiment of the present invention, an Error Correction Code (ECC) decoder, including:

a syndrome calculation unit, which is coupled to produce from a set of bits, which represent data that has been encoded with the ECC, multiple syndromes by applying to the bits vector operations in a vector space, wherein each syndrome is produced by applying the vector operations to the set of bits using a respective, different basis of the vector space;

an Error Locator Polynomial (ELP) computation unit, which is configured to generate, based on the multiple syndromes, an ELP whose roots are indicative of locations of respective errors in the set of bits; and a root search unit, which is coupled to identify at least some of the roots of the ELP so as to correct the errors indicated by the identified roots.

There is additionally provided, in accordance with an embodiment of the present invention, an Error Correction Code (ECC) decoder, including:

root search circuitry, which includes multiple serial multipliers and is configured to accept coefficients of an Error Locator Polynomial (ELP), which is defined over a field and whose roots are indicative of locations of respective errors in a set of bits, which represent data that has been encoded with the ECC, and to evaluate the ELP on a given element of the field by operating on the coefficients using respective ones of the serial multipliers, such that each serial multiplier performs a sequence of multiplication cycles and produces an interim result in each cycle; and control logic, which is configured to terminate the multiplication cycles before completion of the sequence responsively to detecting, during the sequence of the multiplication cycles, at least one interim result indicating that the given element is not one of the roots of the ELP, and to correct at least one error indicated by the given element when the interim results indicate that the given element is a root of the ELP.

There is further provided, in accordance with an embodiment of the present invention, an Error Correction Code (ECC) decoder, including:

root search circuitry, which includes multiple logic components that are clocked by a clock signal, and is coupled to accept an Error Locator Polynomial (ELP), which has a given rank and is defined over a field, and whose roots are indicative of locations of respective errors in a set of bits, which represent data that has been encoded with the ECC, and to identify the roots of the ELP using the logic components so as to correct the errors indicated by the identified roots; and a control unit, which is configured to selectively disable the clock signal to some of the logic components based on the rank of the ELP, so as to cause the root search circuitry to identify the roots of the ELP using only the logic components for which the clock signal has not been disabled.

The present invention will be more fully understood from the following detailed description of the embodiments thereof, taken together with the drawings in which:

DETAILED DESCRIPTION OF EMBODIMENTS

Overview

Figure 1:
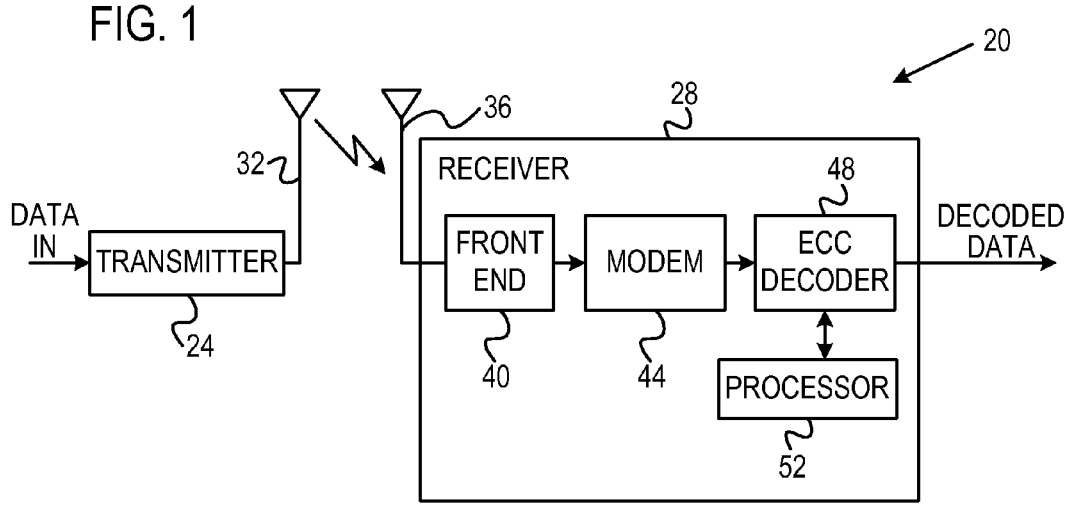
FIG. 1 is a block diagram that schematically illustrates a communication system that employs Error Correction Coding (ECC), in accordance with an embodiment of the present invention.

Power consumption and hardware size are prime considerations in many ECC decoding applications. For example, ECC decoders are commonly used in small and low-cost communication, computing and storage devices, which operate on battery power. In these sorts of devices, it is important to minimize the power consumption and the physical size of the ECC decoder, in order to reduce the battery life, physical size and cost of the device.

Embodiments of the present invention provide improved methods and apparatus for ECC decoding. These techniques achieve considerable reduction in hardware size and power consumption in comparison with known solutions. The disclosed techniques are suitable for various kinds of ECC that use syndromes and Error Locator Polynomials (ELPs), such as Bose-Chaudhuri-Hocquenghem (BCH) codes and Reed-Solomon (RS) codes.

In a typical embodiment, an ECC decoder accepts input code words that may contain errors. The ECC decoder operates on each input code word to produce multiple syndromes of the code word. Using the syndromes, the ECC decoder generates an ELP, whose roots are indicative of locations of errors in the code word. The ECC decoder then finds the ELP roots, and corrects the errors indicated by the roots.

The computation of a given syndrome can be represented as a multiplication of a matrix by a vector in a certain vector space. In some embodiments, the ECC decoder is designed so that the vector operations (e.g., multiplications) associated with the computation of each syndrome are performed using a different basis of the vector space. Each basis is selected such that the multiplied matrix is sparse, i.e., has only a small number of non-zero elements. As a result, the multiplications can be implemented using smaller-size hardware that consumes less power.

Typically, the ELP is defined over a Galois Field (GF), and the ECC decoder finds the ELP roots by evaluating the ELP on different field elements. In some embodiments, the ECC decoder evaluates the ELP by operating a set of serial multipliers, each of which operates on a respective ELP coefficient. Each serial multiplier operates on the respective coefficient in a sequence of computation cycles, and produces an interim result in each cycle. The ECC decoder monitors the interim results during the computation sequence. If, during the sequence, the ECC decoder detects at least one interim result indicating that the currently-evaluated field element is not a root of the ELP, the computation sequence is terminated before its completion. Unlike ECC decoders that use parallel multipliers in which the ELP is fully evaluated for each field member, the disclosed technique terminates the evaluation process of a given field element as soon as the element is found not to be an ELP root. As a result, the power consumption of the root search process is reduced. Moreover, since serial multipliers are typically smaller than comparable parallel multipliers, the hardware size of the disclosed configurations is relatively small.

The rank of a given ELP indicates the number of errors in the corresponding code word. In the ECC decoder, the logic that searches for ELP roots is typically dimensioned according to the maximum error correction capability of the decoder, i.e., the maximum specified ELP rank. In many cases, however, the number of errors in a code word is lower than the maximum number, and the actual ELP rank is thus lower than the maximum specified rank.

Therefore, in some embodiments, the ECC decoder reduces its power consumption by selectively deactivating clock signals provided to the root search logic, based on the actual rank of the ELP. Using this technique, only the logic components (e.g., registers and multipliers) that actually participate in the root search of the actual ELP are provided with clock signals. The ECC decoder may also modify the clock speed based on the actual ELP rank, so as to further control the decoder's power consumption. In some embodiments, when a certain ELP root is found during the search process, the decoder divides the ELP so as to factor out this root, and continues the search with the lower-rank ELP. Using this technique, the decoder's power consumption decreases with time, as additional roots are found and the ELP rank is reduced.

Several efficient hardware configurations that implement the disclosed techniques are described and discussed hereinbelow.

System Description

Figure 2:
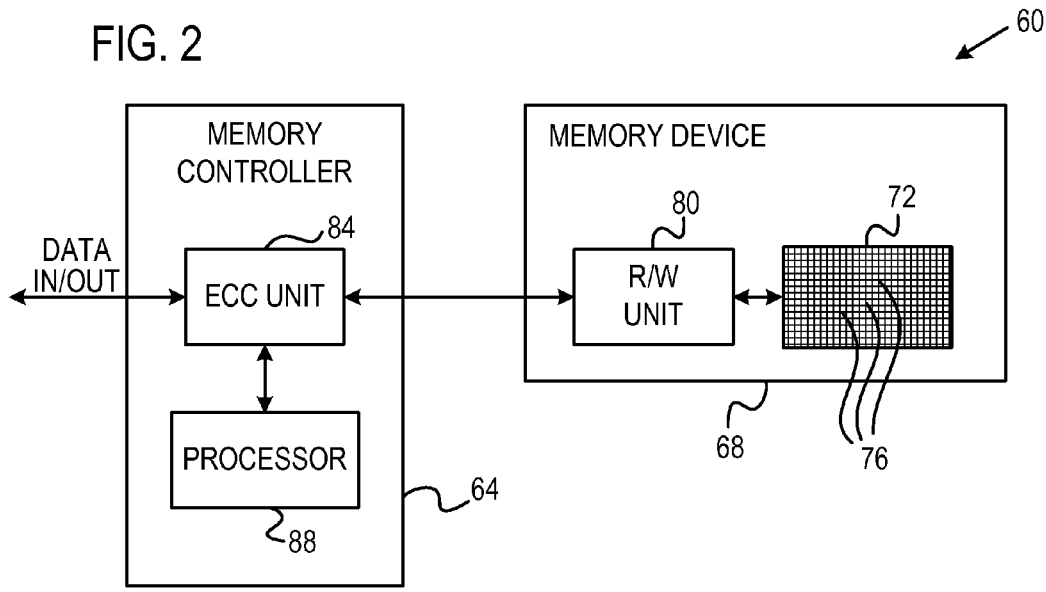
FIG. 2 is a block diagram that schematically illustrates a data storage system that employs ECC, in accordance with an embodiment of the present invention.

Embodiments of the present invention provide improved methods and systems for decoding Error Correction Codes (ECC), such as Bose-Chaudhuri-Hocquenghem (BCH) or Reed-Solomon (RS) codes. The disclosed techniques can be used in a wide variety of systems and applications in which ECC is deployed, such as in various communication and data storage systems. FIGS. 1 and 2 below illustrate two example applications.

FIG. 1 is a block diagram that schematically illustrates a wireless communication system 20 that employs error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. The performance of decoder 48 is enhanced by a processor 52, using methods that are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

FIG. 2 is a block diagram that schematically illustrates a data storage system 60 that employs error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. The performance of unit 84 in decoding the ECC is enhanced by a processor 88, using methods that are described in detail below. The ECC used in systems 20 and 60 may comprise, for example, a suitable BCH or RS code, as well as various other types of ECC.

Processors 52 and 88, ECC decoder 48 and ECC unit 84 can be implemented in software, in hardware or using a combination of hardware and software elements. In some embodiments, processors 52 and 88 comprise general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory.

The ECC decoding schemes described herein can be used in communication systems such as system 20, as well as in data storage systems such as system 60. The description that follows applies to both communication applications and to storage applications, and refers generally to an ECC decoder and a processor. Any reference to the ECC decoder applies to decoder 48 of system 20, as well as to the decoder functionality of unit 84 in system 60. Any reference to the processor applies to processor 52 of system 20, as well as to processor 88 in system 60. Alternatively, the methods described herein can be carried out by any suitable element in any suitable system that involves ECC decoding.

Figure 3:
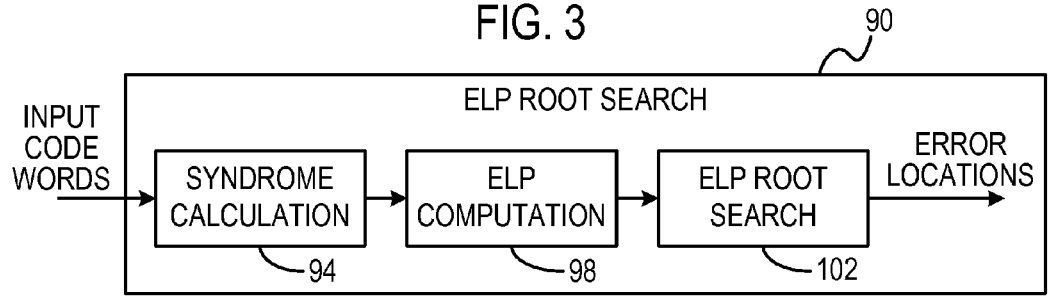
FIG. 3 is a block diagram that schematically illustrates an ECC decoder, in accordance with an embodiment of the present invention.

FIG. 3 is a block diagram that schematically illustrates an ECC decoder 90, in accordance with an embodiment of the present invention. ECC decoder 90 accepts ECC code words, which may contain errors. In other words, the input code words may not always comprise valid code words of the ECC. The ECC decoder decodes the input code words while attempting to correct these errors, so as to reconstruct the data conveyed in the code words. In a typical implementation, each code word comprises on the order of several hundred to several thousand bits, although any other suitable code word size can be used.

Decoder 90 comprises a syndrome calculation unit 94, which calculates a syndrome for each input code word. The syndrome is typically defined as Hy=S, wherein H denotes the parity check matrix of the ECC, y denotes an input code word and S denotes a vector of T syndromes of code word y, denoted $S_1 \ldots S_T$. T denotes the maximum number of errors that the ECC is able to correct per code word. When input code word y contains no errors (i.e., when y is a valid code word), Hy=0.

When the ECC is defined over a certain finite Galois Field (GF) having a primitive field element (also referred to as a field-generating element) $\alpha$, the $k^{th}$ syndrome $S_k$ can typically be written as $$S_k = \sum_{i=0}^{n-1} b_i \alpha^{ki}$$

(or as $$S_k = \sum_{i=0}^{n-1} b_i \alpha^{n-1-ki}$$

if the bit order is reversed), wherein $b_i$ denote the bits of the input code word. For a BCH code, coefficients $b_i$ are elements of the field GF(p), and each syndrome $S_k$ is an element of the field GF($p^m$). For a Reed-Solomon code, both coefficients $b_i$ and the syndromes $S_k$ are elements of the field GF($p^m$). The description that follows refers mainly to codes defined over GF($2^m$), although the methods and systems described herein are applicable to codes defined over any other suitable field. In a typical implementation, m=4 ($2^m$=16), although any other suitable value of m can also be used. Unit 94 typically computes and outputs a set of T syndromes for each input code word.

(The description given herein refers mainly to BCH and RS codes, although it is applicable to various other codes that are defined by multiples of a given polynomial. In general, the syndromes are produced by applying the roots of this polynomial to the received code word.)

The syndromes output by unit 94 are processed by an Error Locator Polynomial (ELP) computation unit 98. For a given set of T syndromes corresponding to a given code word, unit 98 determines an ELP defined over GF($2^m$) whose roots are indicative of the error locations in the given code word. The ELP can be written as ELP(x)=1+$a_1$x+$a_2$x$^2$+ . . . +$a_j$x$^j$, wherein j denotes the rank of the ELP, j≦T. Unit 98 may apply any suitable method in order to compute the ELP for a given code word, such as, for example, the Berlekamp-Massey method, the Euclidean method or the Peterson Gorenstein Zierler method, cited above.

Unit 98 provides the ELPs to an ELP root search unit 102. Unit 102 determines the roots of each ELP, i.e., the elements x of GF($2^m$) for which ELP(x)=0. For a given code word, the ELP roots are indicative of the locations of the errors within the code word. ECC decoder 90 then corrects the errors at the identified locations. For a BCH code, the ELP roots identify the erroneous bits in the code word, and the decoder corrects the errors by reversing the values of the identified bits. In a RS code, on the other hand, the ELP roots indicate the erroneous symbols in the code words. In this case, decoder 90 determines the error values in addition to the error locations in order to correct the errors. The correction functionality can be carried out either by unit 102 or by other circuitry (not shown in the figure) in decoder 90.

Typically, units 94, 98 and 102 are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements. An efficient configuration for implementing unit 94 is described in FIGS. 4 and 5 below. Several efficient schemes for locating ELP roots are described in FIGS. 6-11 below.

Efficient Syndrome Calculation

As noted above, a syndrome $S_k$ can be expressed as $$S_k = \sum_{i=0}^{n-1} b_i \alpha^{ki},$$

wherein $b_i$ denote the bits of the input code word and $\alpha$ denotes a primitive element of the Galois field. The syndrome can be calculated bit-by-bit by calculating $$S_k^{i+1} = S_k^i \alpha^k + b_i.$$

A more efficient calculation processes a group of r bits at a time by calculating $$S_k^{i+r} = S_k^i \alpha^{kr} + \sum_{l=0}^{r-1} b_{i+r-1-l} \alpha^{rl} \quad [1]$$

Figure 4:
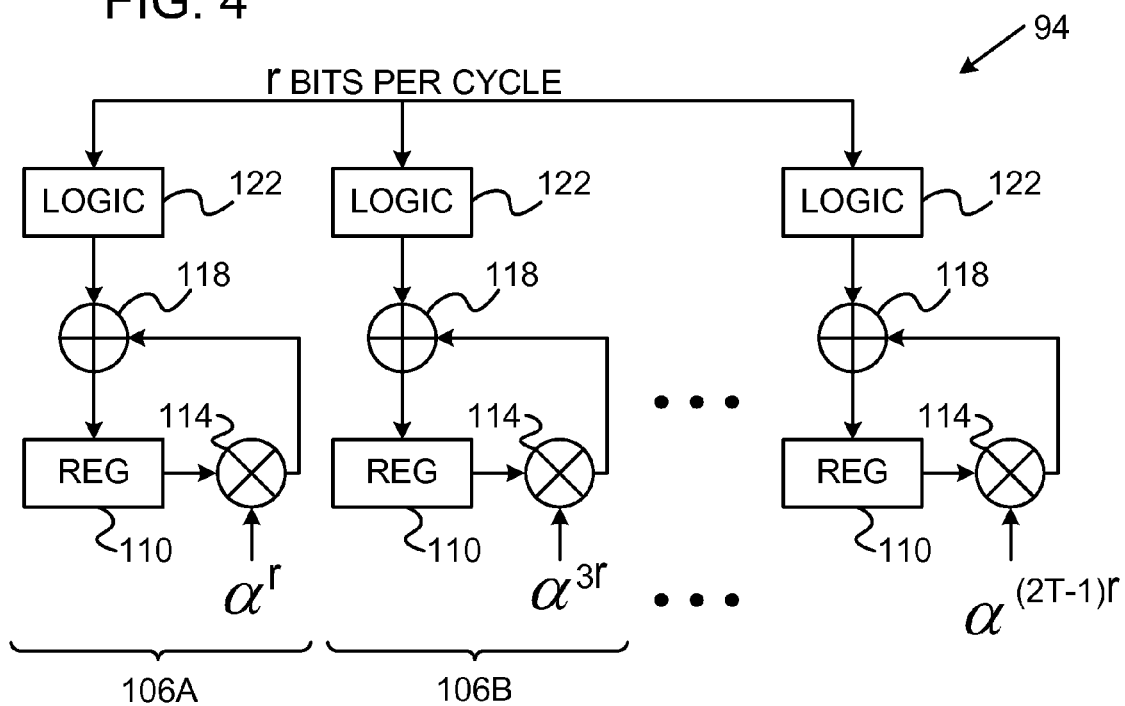
FIG. 4 is a block diagram that schematically illustrates a syndrome calculation unit, in accordance with an embodiment of the present invention.

FIG. 4 is a block diagram that schematically illustrates the internal structure of syndrome calculation unit 94, in accordance with an embodiment of the present invention. In the present example, unit 94 comprises multiple syndrome calculation modules 106A, 106B . . . . The syndrome calculation modules operate in parallel on a given code word, such that each module calculates a respective syndrome of the code word.

In each clock cycle, each syndrome calculation module accepts r bits from the code word, and carries out the calculation of Equation [1] above. Each syndrome calculation module in unit 94 comprises a register 110, a Galois field multiplier 114, an adder 118 and logic 122. Consider the $k^{th}$ syndrome calculation module, which calculates syndrome $S_k$. In a given iteration, register 110 of this syndrome calculation module holds the previous value of the syndrome $$(S_k^i),$$

and multiplies this value by $\alpha^{kr}$ to produce the first term on the right-hand-side of Equation [1]. Logic 122 calculates the second term $$\left(\sum_{l=0}^{r-1} b_{i+r-1-l}\alpha^{rl}\right).$$

Adder 118 adds the two terms, and stores the result $$(S_k^{i+r})$$

back in the register 110. At the end of the iterative process, register 110 holds the value of syndrome $S_k$.

The task of multiplying $$S_k^i$$

by $\alpha^{kr}$ can be represented as a set of vector operations that implement matrix multiplication. In this representation, the set of m powers of the field-generating element α form a basis that spans $GF(2^m)$. Thus, any element of the $GF(2^m)$ field can be represented as $$\sum_{i=0}^{m-1} d_i \alpha^i,$$

wherein $d_i$ comprise binary bits, i.e., as an m-tuple of binary bits. In particular, since syndrome $S_k$ is an element in field $GF(2^m)$, it can be represented as such an m-tuple. The task of multiplying a Galois field element d, which is represented by the coefficients $d_0 \ldots d_{m-1}$, by a constant k, comprises a linear operation on the coefficients $d_0 \ldots d_{m-1}$. This task can therefore be carried out by a matrix multiplication in GF(2), of the form c=k·d, such that $$c_i = \sum_{j=0}^{m-1} k_{ij} d_j.$$

In unit 94, the above-mentioned matrix multiplication is carried out by multiplier 114 in each syndrome calculation module. The multiplier typically comprises digital logic circuitry (e.g., multiple XOR gates or other logic), which carries out this multiplication. The hardware complexity and power consumption of this logic circuitry grow with the number of non-zero elements of the matrix representing $\alpha^{kr}$.

In some embodiments, each syndrome calculation module reduces the complexity and power consumption of the syndrome calculation process by transforming the calculation to a different vector space in which the matrix representing $\alpha^{kr}$ is sparse, i.e., contains a small number of non-zero elements. When the matrix representing $\alpha^{kr}$ is sparse, the task of multiplying $$S_k^i$$

by $\alpha^{kr}$ comprises a relatively small number of logic computations. As a result, the hardware (e.g., logic gates) carrying out this task in multipliers 114 can be reduced in size. The power consumption of the decoder is thus reduced, as well.

Transformation of the matrix to the desired vector space is performed by representing the matrix by a different basis. One possible way to transform a general matrix A into a sparse representation is to select an arbitrary vector y, and construct a basis of the form $\{y, Ay, \ldots, A_i y, \ldots \}$. In other words, each basis element comprises vector y, multiplied by a different power of matrix A. The representation of matrix A using this basis is a matrix in which (1) one row (or column) has non-zero elements, (2) the elements in one of the off-diagonals are equal to unity, and (3) all other elements are zero. This scheme can be generalized in a straightforward manner to rectangular matrices and to matrices that do not fully span the vector space.

Using the above-described scheme, matrix $\alpha^{kr}$ (which is used by the $k^{th}$ syndrome calculation module in calculating $$S_k^i)$$

is transformed to a basis whose elements comprise an arbitrary vector y multiplied by different powers of $\alpha^{kr}$. For implementation reasons, vector y is typically selected as 1, although any other vector can also be selected. When y=1, the new basis has the form $\{1, \alpha^{kr}, \alpha^{2kr}, \alpha^{3kr}, \ldots, \alpha^{(m-1)kr}\}$. (Typically, each syndrome is computed using a different basis.)

The resulting matrix, after basis transformation, is an m-by-m binary matrix having at most 2m−1 non-zero elements. The original matrix before basis transformation is typically balanced, i.e., has approximately $m^2/2$ non-zero elements. Thus, the basis transformation described above reduces the hardware size and power consumption of multipliers 114 by a factor of ~m/4. Moreover, before basis transformation the hardware size and power consumption are on the order of $O(m^2)$, and the basis transformation reduces them to an order of O(m).

When carrying the basis transformation described above, Equation [1] above takes becomes:

$$(S_k^{i+r}) = ([\alpha^{kr}] \ldots [\alpha^{kr+m-1}])(S_k^i) + ([1][\alpha^k] \ldots) \begin{pmatrix} b_i \\ b_{i+1} \\ \vdots \end{pmatrix} \quad [2]$$

wherein $[\alpha^k]$ is a column vector of the coefficients of $\alpha^k$ in the standard basis (i.e., before transformation).

The transformation matrix R, which transforms the new basis to the original basis, comprises the columns of the new basis expressed using the original basis, i.e.:

$$R = ([1][\alpha^{kr+1}] \ldots [\alpha^{kr(m-1)}]) \quad [3]$$

The basis transformation is thus given by $$\tilde{S}_k^{i+r} = AS_k^i + B\vec{b} \quad [4]$$

wherein A and B are given by:

$$A = R^{-1}([\alpha^{kr}][\alpha^{kr+1}] \ldots [\alpha^{kr+m-1}])$$

The transformation back from the new basis to the original basis is given by $$S_k^i = R\tilde{S}_k^i \quad [7]$$

In summary, multiplier 114 of the $k^{th}$ syndrome calculation module in unit 94 comprises circuitry, which multiplies $$S_k^i$$

by $\alpha^{kr}$ using the above-mentioned basis transformation that is applicable for the $k^{th}$ syndrome $S_k$. The multiplier may also comprise circuitry that transforms the computed syndrome back to the original basis, or to any other basis in which different syndromes can compared and further processed. For example, transformation back to the original basis can be performed before providing the syndromes to ELP computation unit 98. Alternatively, unit 98 may consider the basis in which each syndrome is represented when computing the ELP. In the latter implementation, transformation to the original basis can be omitted.

Although the description above refers to BCH codes, the basis transformation scheme can be adapted to other cyclic block codes that use syndromes, such as RS codes. The above-mentioned process can be applied for any desired value of r, i.e., for iterative processes that compute the syndromes based on one or more bits per iteration. The above-mentioned process can be applied in hardware, in software or using a combination of hardware and software elements.

Figure 5:
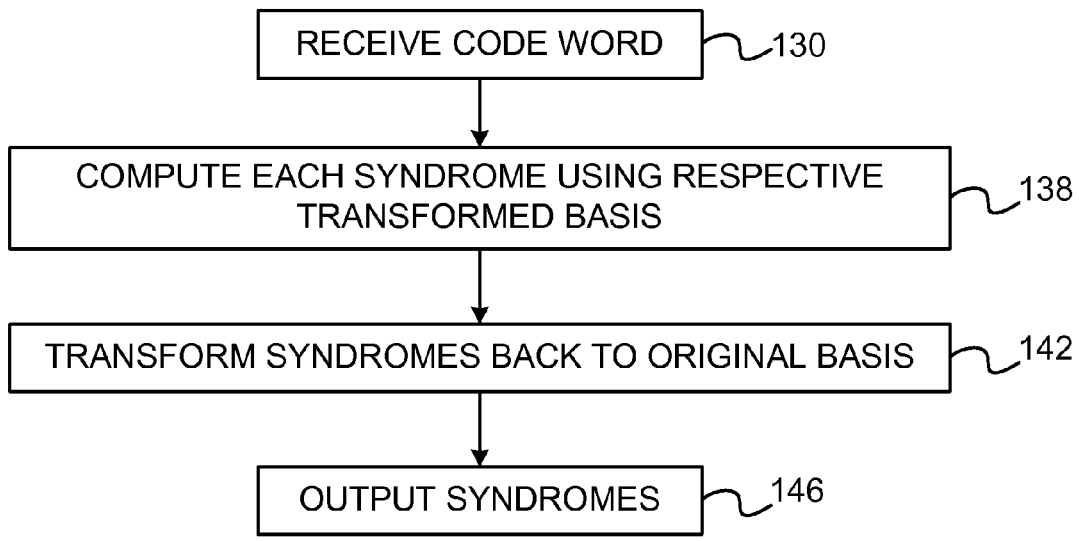
FIG. 5 is a flow chart that schematically illustrates a method for syndrome calculation, in accordance with an embodiment of the present invention.

FIG. 5 is a flow chart that schematically illustrates a syndrome calculation method, carried out by unit 94, in accordance with an embodiment of the present invention. The method begins with syndrome calculation unit 94 accepting a code word, at an input step 130. Each syndrome calculation module (106A, 106B, . . . ) in unit 94 computes a respective syndrome of the input code word, at a syndrome computation step 138. Each syndrome computation module computes the syndrome using the transformed basis that is applicable to this syndrome, as described above. Typically, each syndrome calculation module computes the syndrome in an iterative process, which processes r bits of the code word in each iteration ($r \geq 1$). In some embodiments, although not necessarily, the syndrome calculation modules transform the syndromes back to the original basis, at a backward transformation step 142. Unit 94 provides the computed syndromes to ELP root search unit 102, at an output step 146.

Efficient ELP Root Searching

As noted above, ELP root search unit 102 receives a set of ELP coefficients for each input code word from ELP computation unit 98. Unit 102 processes the ELP coefficients so as to identify the roots of the ELP. As long as the number of errors in the code word does not exceed T, the ELP roots are indicative of the locations of errors in the input code word, and therefore locating the ELP roots enables correction of the errors. In the description that follows, the ELP is given by ELP(x)=$1+a_1x+a_2x^2+ \ldots +a_jx^j$, wherein coefficients $a_1 \ldots a_j$ are provided by unit 98. Unit 102 searches the GF($2^m$) field in an attempt to find the field elements for which ELP(x)=0.

Evaluating ELP(x) for various field elements typically involves multiplying the ELP coefficients by elements of the GF($2^m$) field, and more specifically multiplying the ELP coefficients by powers of the field-generating element $\alpha$. Each such multiplication multiplies a certain field element by a certain ELP coefficient. Some known methods perform these multiplications using parallel Galois Field (GF) multipliers, such that each multiplier multiplies a certain field element by a certain ELP coefficient in a single clock cycle.

Embodiments of the present invention that are described below provide improved root search configurations, which perform the above-mentioned multiplications using serial GF multipliers. In the present context, the term "serial multiplier" means any multiplier that multiplies a certain field element by a certain ELP coefficient in multiple clock cycles, and outputs one or more bits of the final product (typically one bit) in each clock cycle. Examples of serial multipliers are described on pages 265-267 of Blahut's "Algebraic Codes for Data Transmission," Cambridge University Press, 2004, which is incorporated herein by reference. Alternatively, however, any other suitable serial multiplier configuration can also be used.

The objective of the root search process is to find field elements for which ELP(x)=0. Therefore, even a single non-zero bit produced by the serial multiplier indicates that the multiplied field element is not a root of the ELP. Thus, when a given serial multiplier outputs a bit of the product that is non-zero, the multiplication process can be terminated before its completion. This scheme reduces the number of multiplications performed in the root search process, since most of the multiplication operations, which multiply field elements that are not ELP roots, are terminated before completion. As a result, the power consumption of the root search process is reduced considerably. The hardware size (e.g., gate count) of a serial multiplier is also considerably smaller than that of a comparable parallel multiplier.

Figure 6:
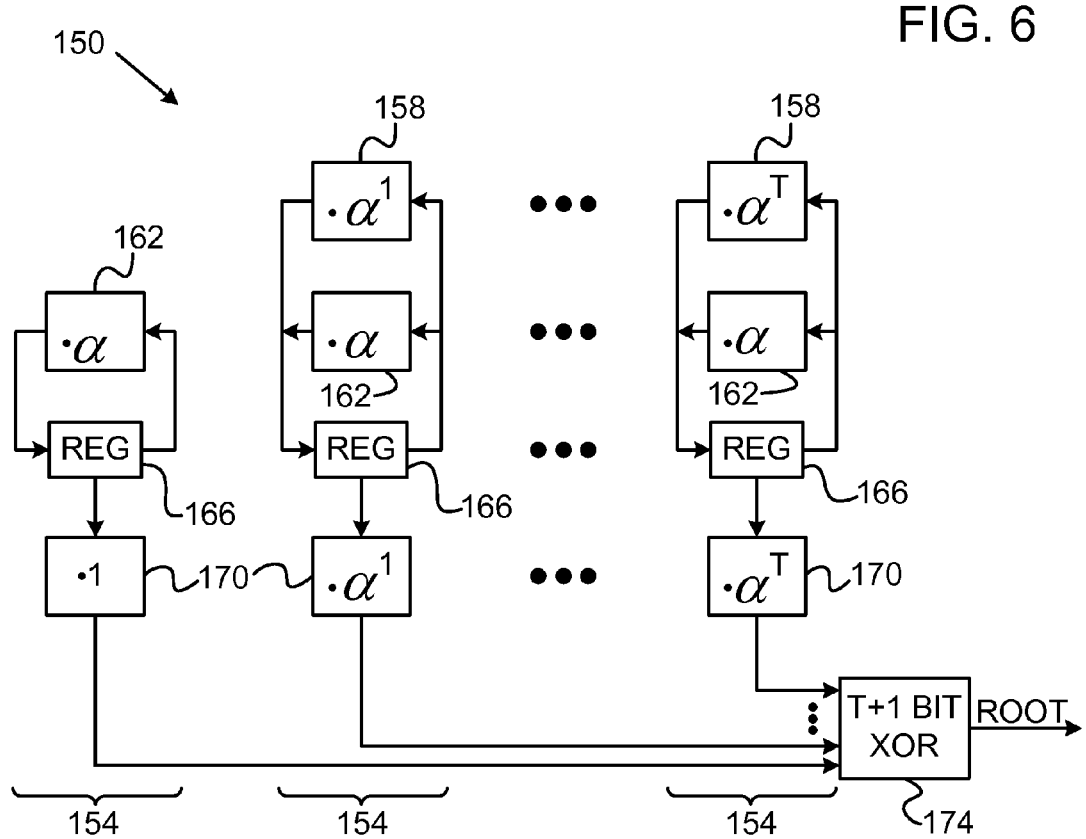
FIG. 6 is a block diagram that schematically illustrates an ELP root calculation unit, in accordance with an embodiment of the present invention.

FIG. 6 is a block diagram that schematically illustrates an ELP root calculation unit 150, in accordance with an embodiment of the present invention. The configuration of unit 150 can be used to implement unit 102 in FIG. 3 above. Unit 150 comprises T+1 coefficient multiplication modules 154. The $k^{th}$ module 154 evaluates the $k^{th}$ term of ELP(x), i.e., $a_kx^k$, k=0 . . . T-1.

Each module 154 comprises parallel multipliers 158 and 162, a register 166 and a serial multiplier 170. In the $k^{th}$ module 154, parallel multiplier 158 multiplies the content of register 166 by $\alpha^k$. Parallel multiplier 162 multiplies the content of register 166 by $\alpha$, and is therefore relatively simple and inexpensive. The two parallel multipliers are operated only once per each evaluated field element, as will be shown below.

In order to evaluate $a_kx^k$ in the $k^{th}$ module 154, register 166 is initialized with the ELP coefficient $a_k$. Then, a sequence of m cycles is performed, in which serial multiplier 170 multiplies the content of register 166 by $\alpha^k$. The m cycles are performed concurrently in the T+1 modules 154. At the end of each cycle, each serial multiplier 170 produces one bit of its final product. This bit is referred to as an interim result.

In each cycle, a XOR unit 174 computes the Exclusive OR (XOR) of the T+1 interim results produced by modules 154. Thus, if unit 174 outputs a "1" at any time during the m-cycle multiplication process, unit 150 may conclude that the currently-evaluated field element is not an ELP root. In such a case, the multiplication process can be terminated, and unit 150 can proceed to evaluate the next field element.

Figure 7:
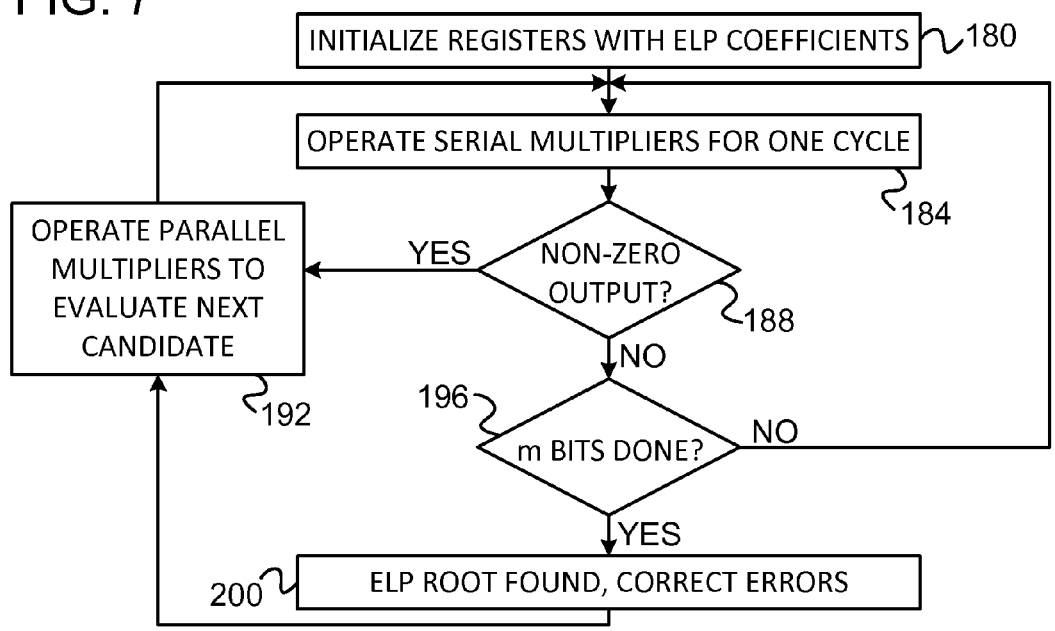
FIG. 7 is a flow chart that schematically illustrates a method for ELP root calculation, in accordance with an embodiment of the present invention.

FIG. 7 is a flow chart that schematically illustrates a method for ELP root calculation, carried out by unit 150, in accordance with an embodiment of the present invention. Unit 150 scans the GF field elements $(1, \alpha, \alpha^2, \alpha^3, \ldots)$ sequentially, in order to identify which of the field elements are roots of the ELP.

The method begins with unit 150 initializing registers 166 with the ELP coefficients, at an initialization step 180. Unit 150 now carries out a sequence of m cycles, in which serial multipliers 166 multiply their respective ELP coefficients by the appropriate powers of the currently-evaluated field element.

Unit 150 operates the serial multipliers for a single cycle, at a cycle operation step 184. At the end of this cycle, each serial multiplier produces a respective interim result, i.e., one bit of the final product. Unit 174 calculates a XOR of the T+1 interim results. Unit 174 checks whether XOR result after the current cycle is non-zero, at a non-zero checking step 188. If the XOR operation produces a non-zero output, unit 174 terminates the m-cycle sequence and proceeds to evaluate the next field element, at a next candidate step 192. When proceeding to the next field element, parallel processors 158 and 162 of modules 154 are operated to calculate the next power of $\alpha$. Unit 174 thus functions as control logic, which monitors the interim results of the serial multipliers and terminates the multiplication sequence when appropriate.

If, on the other hand, the output of unit 174 is zero, the m-cycle multiplication sequence continues. Unit 150 checks whether all m cycles have been completed. If not, the method loops back to step 184 above in order to proceed to the next cycle in the sequence. If all m cycles have been completed, and the output of unit 174 has been zero during the entire sequence, unit 150 identifies the currently-evaluated field element as a root of the ELP, at a root identification step 200. Unit 150 may correct the error at the location indicated by the identified root, or report the identified root or error location to decoder 90. The method then loops back to step 192 above, in which unit 150 proceeds to evaluate the next field element. This process of FIG. 7 typically continues until all field elements have been evaluated or until T roots have been found.

Figure 8:
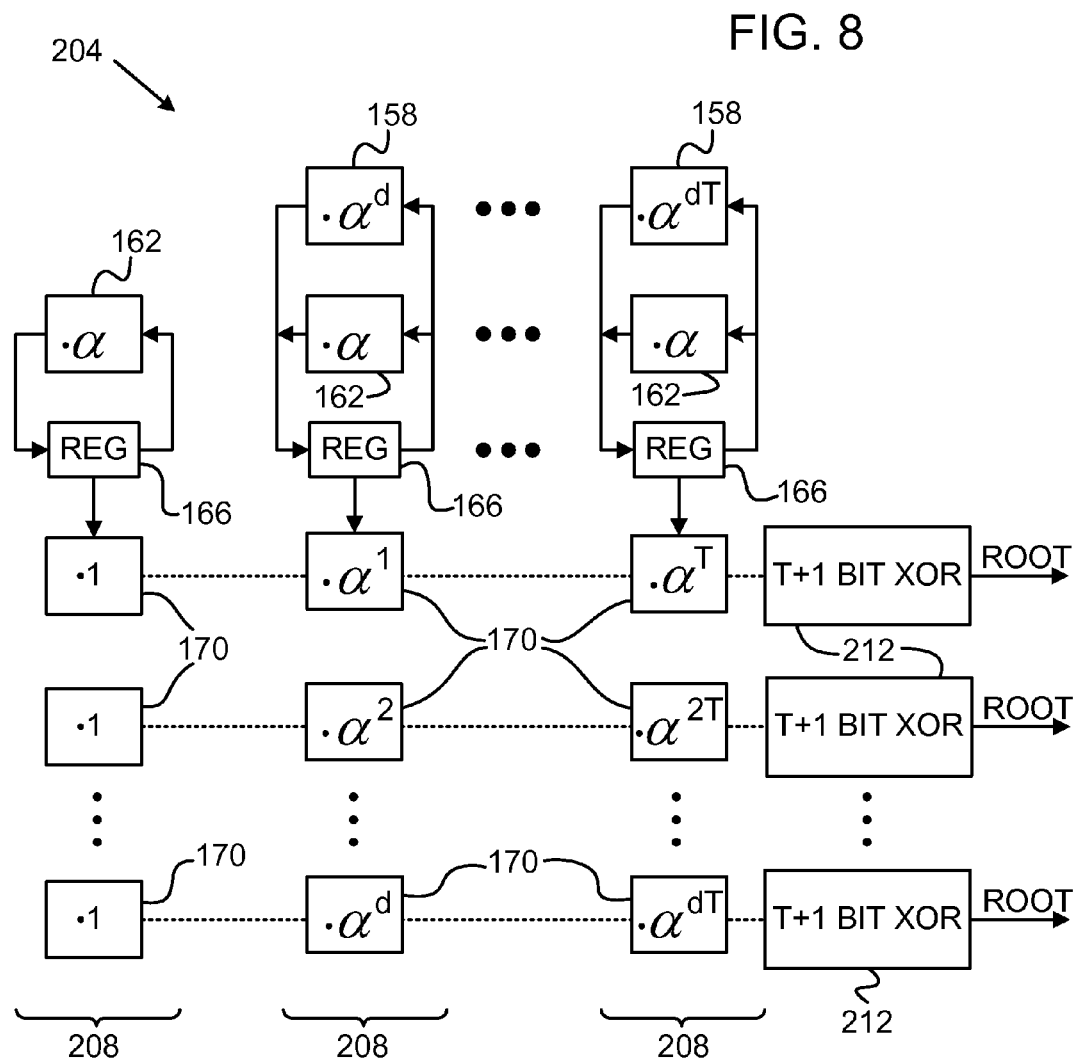
FIGS. 8 and 9 are block diagrams that schematically illustrate ELP root calculation units, in accordance with alternative embodiments of the present invention.

FIG. 8 is a block diagram that schematically illustrates an ELP root calculation unit 204, in accordance with an alternative embodiment of the present invention. In this configuration, the ELP root calculation unit evaluates multiple GF field elements concurrently. Unit 204 comprises T+1 coefficient multiplication modules 208. In this configuration, however, each module 208 comprises d serial multipliers 170. Each row of serial multipliers 170 in FIG. 204 evaluates a respective field element. The outputs of the serial multipliers in a given row are connected to a respective XOR unit 212, which calculates the XOR of the T+1 interim results produced by the serial multipliers.

In the configuration of FIG. 8, a set of d field elements are evaluated concurrently in each m-cycle multiplication sequence of the serial multipliers. Parallel multipliers 158 and 162 are operated only once per each set of d field elements. Thus, the overhead of operating the parallel multipliers is divided among d field elements, instead of a single field element as in FIG. 6 above. Thus, the configuration of FIG. 8 provides improved power consumption and latency in comparison with the configuration of FIG. 6 above.

At any time during the m-cycle multiplication sequence, if a certain XOR unit 212 produces a non-zero output, unit 204 may conclude that the field element evaluated by the respective row of serial multipliers is not an ELP root. When a given XOR unit 212 produces a non-zero output, unit 204 may terminate the operation of the respective row of serial multipliers in order to reduce power consumption. Alternatively, unit 204 may wait for a situation in which all XOR units produce non-zero outputs, and then terminate the entire m-cycle sequence and proceed to the next set of d field elements.

Thus, units 212 function collectively as control logic, which monitors the interim results produced by the serial multipliers and terminates one or more of the multiplication sequences as appropriate.

The configurations of FIGS. 6 and 8 above are example configurations, which are chosen for the sake of conceptual clarity. Any other suitable configuration can also be used. For example, the field elements can be scanned in any desired order, such as by using other primitive field elements, or by multiplying by $\alpha^{-1}$ instead of by $\alpha$. As another example, the serial multipliers in a given row of FIG. 8 can be scaled by a constant in order to reduce gate count and power consumption. Such scaling does not affect the ELP roots. Additionally or alternatively, parallel multipliers 158 and/or 162 can be scaled by a constant, so that registers 166 begin the m-cycle sequence with a certain offset. Again, this scaling does not affect the ELP roots.

In some embodiments, each row of serial multipliers 170 in FIG. 8 can be split into two halves, and each half operated to evaluate a separate field element. Such a configuration is useful when the code word contains a small number of errors, such that the actual rank of the ELP is T/2 or less. In such a situation, unit 204 can evaluate 2d field elements concurrently, two field elements per row, thus reducing power consumption and latency. In order to support this sort of functionality, XOR unit 212 should calculate the XOR of the interim results of each half row separately.

Reducing Power Consumption of Root Search Based on Actual ELP Rank

In many practical cases, the actual number of errors j in a given code word is smaller than the maximum number of correctable errors T. In other words, the rank of the ELP may be lower than T. In some embodiments, the ELP root search unit modifies its operation based on the actual ELP rank, so as to reduce power consumption.

Figure 9:
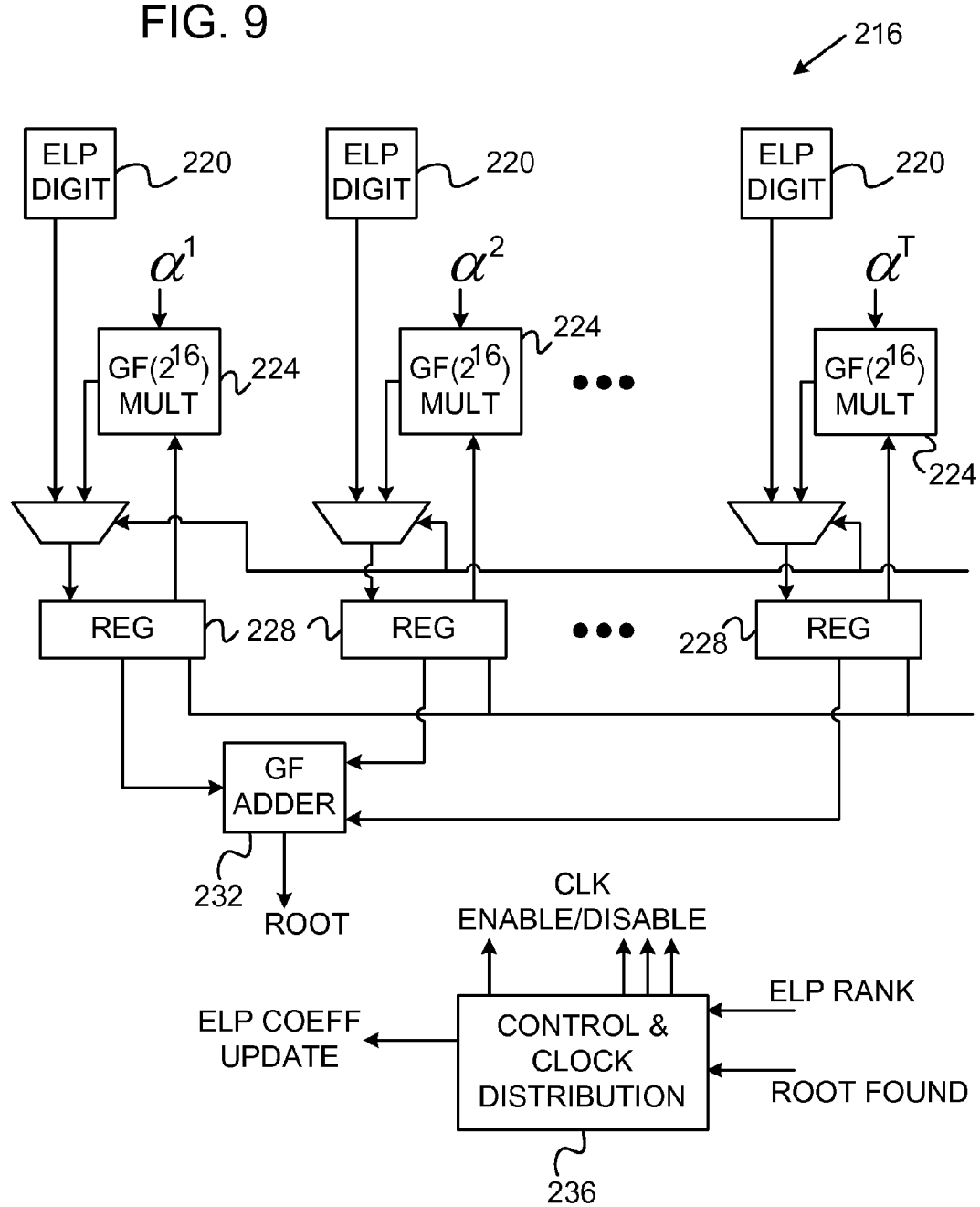

FIG. 9 is a block diagram that schematically illustrates an ELP root calculation unit 216, in accordance with an embodiment of the present invention. The ELP coefficients are stored in T registers 220. Unit 216 applies the ELP to the different Galois field elements using GF multipliers 224 and registers 228. The outputs of registers 228 are combined by a GF adder 232, whose output determines whether the currently-evaluated is an ELP root or not. For example, unit 216 may scan the Galois field elements using the Chien search process, cited above. The present example refers to m=16, although any other suitable value of m can also be used.

Unit 216 further comprises a control unit 236, which controls the different components of unit 216. In particular, control unit 236 provides clock signals to the different multipliers and registers of unit 216. The configuration of registers and multipliers in FIG. 9 is an example configuration. The techniques described below can be applied in any other suitable ELP root search configuration having multipliers registers and other logic components, such as the configurations of FIGS. 6 and 8 above.

The power consumption of unit 216 depends primarily on the power consumption of registers 228 and multipliers 224. For example, the different bits of registers 228 flip their values during operation of unit 216, and this toggling has a considerable impact on power consumption. In particular, when the registers are implemented using Complementary Metal Oxide Semiconductor (CMOS) technology, they consume power mainly during value transitions.

When the actual rank j of the ELP is smaller than T, the root search can be carried out using only a subset of the T registers and multipliers. In some embodiments, control unit 236 supplies clock signals selectively to the different logic components (e.g., multipliers 224 and registers 228), such that a clock signal is provided only to j of the multipliers and registers. The remaining T-j multipliers and registers do not receive clock signals, and their power consumption in minimized. (A typical CMOS flip-flop circuit consumes approximately 30% of its power irrespective of whether its value flips or not, as long as it receives a clock signal.)

Figure 10:
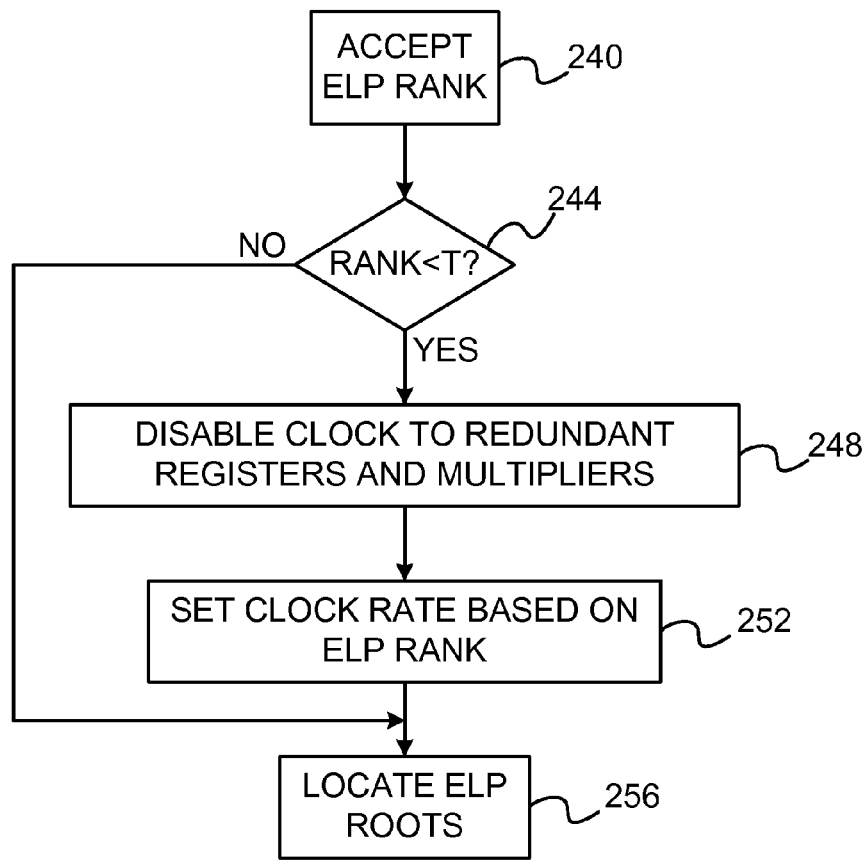
FIGS. 10 and 11 are flow charts that schematically illustrate methods for locating ELP roots, in accordance with embodiments of the present invention.

FIG. 10 is a flow chart that schematically illustrates a method for locating ELP roots, in accordance with an embodiment of the present invention. The description that follows focuses on the identification of ELP roots for a given code word. The method of FIG. 10 begins with control unit 236 in root search unit 216 accepting an indication of the actual ELP rank j, at a rank input step 240. The rank can be accepted, for example, from an ELP computation unit that computes the ELP coefficients (e.g., unit 98 in FIG. 3 above).

Control unit 236 checks whether the actual rank is smaller than the maximum allowable rank T, at a rank checking step 244. If $j<T$, the control unit disables the clock signals to the T-j multipliers and registers corresponding to the most significant ELP coefficients, at a selective clock disabling step 248.

In some embodiments, the control unit can also modify the rate of the clock signal based on the actual ELP rank (i.e., based on the number of active multipliers and registers), at a clock rate setting step 252. Using this technique, the control unit can limit the peak power consumption of unit 216. For example, when j is high and therefore a large number of multipliers and registers are active, control unit 236 may set a relatively low clock rate in order to limit the peak power consumption. When j is low, the control unit may set a higher clock rate, since only a relatively small number of multipliers and registers are active. Because of the different clock rates used, code words having large numbers of errors will typically be decoded more slowly than code words having small numbers of errors. Since code words having large numbers of errors are relatively rare, this degradation is decoding time is typically tolerable. In some embodiments, control unit 236 defines two or more clock rates, which correspond to different ranges of the ELP rank j. For example, the control unit may apply a certain fast clock rate when $j<j1$, divide the fast clock by two for $j1<j<j2$, divide the fast clock by three when $j2<j<j3$, and so on ($j1<j2<j3$).

Unit 216 locates the j ELP roots using the active multipliers and registers, at a root location step 256. (If rank checking step 244 concludes that $j=T$, the method jumps directly to step 256, without disabling clock signals or modifying the clock rate.)

Figure 11:
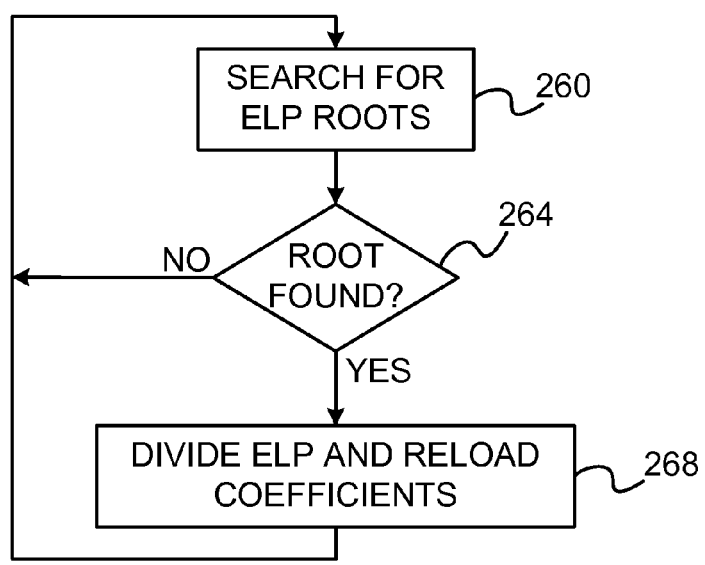

FIG. 11 is a flow chart that schematically illustrates another method for locating ELP roots, in accordance with an embodiment of the present invention. In this method, when an ELP root is identified, control unit 236 divides the ELP by a factor that depends on the identified root, so as to produce a lower rank ELP. The search process continues using the lower rank ELP. When using the method of FIG. 11, the power consumption of unit 216 decreases over time, since the ELP rank decreases with each additional root found. The decrease in power consumption is particularly significant when this method is used in combination with the techniques of FIG. 10 above.

The method of FIG. 11 begins with unit 216 searching for the roots of a certain ELP(x), at a root search step 260. Control unit 236 checks whether a root has been found, at a root checking step 264. When a root $\beta$ is found, control unit 236 divides ELP(x) by $(x-\beta)$, at a division step 268. Any suitable polynomial division method can be used for this purpose. Example methods are described by Blahut in "Theory and Practice of Error Control Codes," Addison-Wesley, 1983, chapter 6, sections 6.1-6.3, pages 130-140, which is incorporated herein by reference. Since $\beta$ is a root of ELP(x), the division has a remainder of zero. The polynomial division lowers the rank of the ELP by 1, without affecting the ELP roots that have not yet been found.

Control unit 236 loads registers 220 with the coefficients of the new, lower-rank ELP. The method then loops back to step 260 above, and unit 216 continue to search for additional ELP roots of the lower-rank ELP. The process continues until all ELP roots are found.

In some embodiments, unit 236 may end the progressive polynomial division when the ELP rank reaches a certain value (e.g., 1, 2 or 3). From that point, the control unit finds the remaining ELP roots using other means, such as using algebraic equation solving methods. This technique further reduces the search time.

When ECC decoder 90 operates on a set of input code words, some of these code words may contain more than T errors per code word. The decoding of such code words will typically fail, since the number of errors per code word exceeds the correction capability of the code. Typically, attempting to decode a code word having more than T errors will produce a rank T ELP, but the root search process will fail.

In some embodiments, decoder 90 defines a certain upper bound $T_0<T$, and attempts to decode only code words whose ELP rank is no more than $T_0$. $T_0$ may be set, for example, to $T-1$, $T-2$ or to any other suitable value. This technique eliminates attempts to decode non-decodable code words (which typically translate to rank T ELPs), and the unnecessary power consumption associated with these attempts. On the other hand, code words whose number of errors is between $T_0$ and T will also not be decoded. In other words, the effective correction capability of the code is reduced from T to $T_0$. In most practical cases, however, such code words are relatively rare and the resulting performance degradation is tolerable and is well worth the reduction in power consumption.

Although the embodiments described herein mainly address decoding of BCH and RS codes in communication and storage applications, the methods and systems described herein can also be used in any other suitable application.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for decoding an Error Correction Code (ECC), comprising:
    using hardware-implemented logic, producing from a set of bits, which represent data that has been encoded with the ECC, multiple syndromes by applying to the bits vector operations in a vector space;
    generating, based on the multiple syndromes, an Error Locator Polynomial (ELP) whose roots are indicative of locations of respective errors in the set of bits; and
    identifying at least some of the roots of the ELP and correcting the errors indicated by the identified roots;
    wherein each syndrome is produced by applying the vector operations to the set of bits using a respective, different basis of the vector space;
    wherein each basis is selected such that vector operations used for producing the respective syndrome comprise a multiplication of a sparse matrix;
    wherein the syndromes are defined over a field having a primitive element, and wherein selecting each basis comprises defining a set of basis elements as respective multiples of a given vector by different powers of the primitive element of the field.

2. The method according to claim 1, wherein the field comprises a Galois field.

3. A method for decoding an Error Correction Code (ECC), comprising:
    accepting coefficients of an Error Locator Polynomial (ELP), which is defined over a field and whose roots are indicative of locations of respective errors in a set of bits, which represent data that has been encoded with the ECC;
    evaluating the ELP on a given element of the field by operating on the coefficients using respective hardware-implemented serial multipliers, such that each serial multiplier performs a sequence of multiplication cycles and produces an interim result in each cycle;
    responsively to detecting, during the sequence of the multiplication cycles, at least one interim result indicating that the given element is not one of the roots of the ELP, terminating the multiplication cycles before completion of the sequence; and
    when the interim results indicate that the given element is a root of the ELP, correcting at least one error indicated by the given element.

4. The method according to claim 3, wherein evaluating the ELP comprises applying the ELP concurrently to multiple elements of the field using respective multiple sets of the serial multipliers.

5. The method according to claim 4, wherein terminating the multiplication cycles comprises terminating the multiplication cycles applied to the multiple elements responsively to determining, based on the interim results, that none of the multiple elements comprises an ELP root.

6. The method according to claim 4, wherein terminating the multiplication cycles comprises terminating the multiplication cycles applied to one of the multiple elements irrespective of termination of the multiplication cycles applied to the other elements.

7. The method according to claim 4, wherein, when a rank of the ELP does not exceed half of a number of the serial multipliers in each of the sets of the serial multipliers, applying the ELP comprises dividing each of the sets of the serial multipliers into first and second subsets, and applying the ELP concurrently to respective first and second elements of the field using the first and second subsets of the serial multipliers.

8. A method for decoding an Error Correction Code (ECC), comprising:
    in an ECC decoder that includes multiple logic components that are clocked by a clock signal, accepting an Error Locator Polynomial (ELP), which has a given rank and is defined over a field, and whose roots are indicative of locations of respective errors in a set of bits, which represent data that has been encoded with the ECC;
    based on the rank of the ELP, selectively disabling the clock signal to some of the logic components that are used for computing the roots of the ELP;
    identifying the roots of the ELP using the logic components for which the clock signal has not been disabled; and
    correcting the errors indicated by the identified roots.

9. The method according to claim 8, wherein the logic components are arranged in a first number of subsets, each of which is assigned to process a respective ELP coefficient, wherein the ELP comprises a second number of ELP coefficients, smaller than the first number, and wherein selectively disabling the clock signal comprises providing the clock signal only to the subsets that are assigned to process the second number of the coefficients.

10. The method according to claim 8, and comprising modifying a rate of the clock signal responsively to the rank of the ELP.

11. The method according to claim 8, and comprising, upon identifying a root of the ELP, dividing the ELP by a factor that depends on the identified root to produce a lower-rank ELP, and continuing to identify the roots of the lower-rank ELP.

12. The method according to claim 8, wherein the logic components comprise at least one component type selected from a group of types consisting of multipliers and registers.

13. An Error Correction Code (ECC) decoder, comprising:
    a syndrome calculation unit, which is coupled to produce from a set of bits, which represent data that has been encoded with the ECC, multiple syndromes by applying to the bits vector operations in a vector space, wherein each syndrome is produced by applying the vector operations to the set of bits using a respective, different basis of the vector space;
    an Error Locator Polynomial (ELP) computation unit, which is configured to generate, based on the multiple syndromes, an ELP whose roots are indicative of locations of respective errors in the set of bits; and
    a root search unit, which is coupled to identify at least some of the roots of the ELP so as to correct the errors indicated by the identified roots;
    wherein the syndrome calculation unit is further coupled to select each basis such that the vector operations used for producing the respective syndrome comprise a multiplication of a sparse matrix;
    wherein the syndromes are defined over a field having a primitive element, and wherein the syndrome calculation unit is coupled to define a set of basis elements as respective multiples of a given vector by different powers of the primitive element of the field.

14. The decoder according to claim 13, wherein the field comprises a Galois field.

15. An Error Correction Code (ECC) decoder, comprising:
    root search circuitry, which comprises multiple serial multipliers and is configured to accept coefficients of an Error Locator Polynomial (ELP), which is defined over a field and whose roots are indicative of locations of respective errors in a set of bits, which represent data that has been encoded with the ECC, and to evaluate the ELP on a given element of the field by operating on the coefficients using respective ones of the serial multipliers, such that each serial multiplier performs a sequence of multiplication cycles and produces an interim result in each cycle; and control logic, which is configured to terminate the multiplication cycles before completion of the sequence responsively to detecting, during the sequence of the multiplication cycles, at least one interim result indicating that the given element is not one of the roots of the ELP, and to correct at least one error indicated by the given element when the interim results indicate that the given element is a root of the ELP.

16. The decoder according to claim 15, wherein the root search circuitry is coupled to apply the ELP concurrently to multiple elements of the field using respective multiple sets of the serial multipliers.

17. The decoder according to claim 16, wherein the control logic is configured to terminate the multiplication cycles applied to the multiple elements responsively to determining, based on the interim results, that none of the multiple elements comprises an ELP root.

18. The decoder according to claim 16, wherein the control logic is configured to terminate the multiplication cycles applied to one of the multiple elements irrespective of termination of the multiplication cycles applied to the other elements.

19. The decoder according to claim 15, wherein, when a rank of the ELP does not exceed half of a number of the serial multipliers in each of the sets of the serial multipliers, the root search circuitry is coupled to divide each of the sets of the serial multipliers into first and second subsets, and to apply the ELP concurrently to respective first and second elements of the field using the first and second subsets of the serial multipliers.

20. An Error Correction Code (ECC) decoder, comprising:
root search circuitry, which comprises multiple logic components that are clocked by a clock signal, and is coupled to accept an Error Locator Polynomial (ELP), which has a given rank and is defined over a field, and whose roots are indicative of locations of respective errors in a set of bits, which represent data that has been encoded with the ECC, and to identify the roots of the ELP using the logic components so as to correct the errors indicated by the identified roots; and a control unit, which is configured to selectively disable the clock signal to some of the logic components based on the rank of the ELP, so as to cause the root search circuitry to identify the roots of the ELP using only the logic components for which the clock signal has not been disabled.

21. The decoder according to claim 20, wherein the logic components are arranged in a first number of subsets, each of which is assigned to process a respective ELP coefficient, wherein the ELP comprises a second number of ELP coefficients, smaller than the first number, and wherein the control unit is configured to provide the clock signal only to the subsets that are assigned to process the second number of the coefficients.

22. The decoder according to claim 20, wherein the control unit is configured to modify a rate of the clock signal responsively to the rank of the ELP.

23. The decoder according to claim 20, wherein the control unit is configured, upon identification of a root of the ELP by the root search circuitry, to divide the ELP by a factor that depends on the identified root to produce a lower-rank ELP, and to cause the root search circuitry to continue identifying the roots of the lower-rank ELP.

24. The decoder according to claim 20, wherein the logic components comprise at least one component type selected from a group of types consisting of multipliers and registers.

* * * * *